US006479383B1

(12) United States Patent
Chooi et al.

(10) Patent No.: US 6,479,383 B1

(45) Date of Patent: Nov. 12, 2002

(54) METHOD FOR SELECTIVE REMOVAL OF UNREACTED METAL AFTER SILICIDATION

(75) Inventors: Simon Chooi, Singapore (SG); Mei Sheng Zhou, Singapore (SG)

(73) Assignee: Chartered Semiconductor Manufacturing LTD, Singapore (SG)

( * ) Notice: Subject to any disclaimer, the term of this patent is extended or adjusted under 35 U.S.C. 154(b) by 0 days.

(21) Appl. No.: 10/068,823

(22) Filed: Feb. 5, 2002

(51) Int. Cl.[7] .......... H01L 21/44

(52) U.S. Cl. .......... 438/682

(58) Field of Search .......... 438/586, 706, 438/711, 768, 683

(56) References Cited

U.S. PATENT DOCUMENTS

| | | | |
|---|---|---|---|
| 3,985,597 A | 10/1976 | Zielinski | 156/11 |
| 4,778,536 A | 10/1988 | Grebinski | 134/36 |
| 5,259,923 A | 11/1993 | Hori et al. | 156/643 |
| 5,358,601 A | 10/1994 | Cathy | 156/656 |
| 6,225,202 B1 | 5/2001 | Gupta et al. | 438/586 |
| 6,231,775 B1 | 5/2001 | Levenson et al. | 216/67 |
| 6,242,165 B1 | 6/2001 | Vaartstra | 134/36 |

*Primary Examiner*—Long Pham

(57) ABSTRACT

A method to remove a metal from over a substrate in the fabrication of an integrated circuit device. The invention comprises providing a metal layer over a substrate. The metal layer is exposed to a reactant gas to form at least a solid metal containing product. The reactant gas preferably contains sulfur and oxygen. The reactant gas more preferably comprises sulfur dioxide or sulfur trioxide. The reactant gas is preferably heated and optionally exposed to a plasma. Next, the metal containing product is removed using a liquid, thereby removing at least portion of the metal layer from over the substrate.

53 Claims, 3 Drawing Sheets

METHOD FOR SELECTIVE REMOVAL OF UNREACTED METAL AFTER SILICIDATION

BACKGROUND OF THE INVENTION

1) Field of the Invention

The invention relates to the fabrication of integrated circuit devices, and more particularly, to a method of removing metals, such as nickel, titanium or cobalt in the fabrication of integrated circuits. The invention further relates to the recovery of the metals.

2) Description of the Prior Art

In the fabrication of integrated circuits, metal silicides are often formed through a rapid thermal annealing (RTA) process. Metals such as titanium, cobalt, and nickel are typically used in silicidation. After RTA, the unreacted metal is typically removed by wet chemicals. For example, SC-1 (Standard Clean-1 comprising ammonium hydroxide, hydrogen peroxide, and de-ionized water) may be used to remove titanium, SC-2 (Standard Clean-2 comprising hydrochloric acid, hydrogen peroxide, and deionized water) and a mixture of sulfuric acid, hydrogen peroxide, and water (SPM) may be used to remove cobalt and nickel. Nitric acid and SPM are also used for the stripping (rework) of cobalt and nickel on bare silicon wafers. The drawbacks of using wet chemicals include the expensiveness of high purity chemicals, disposal costs, and the corrosive nature of the chemicals.

U.S. Pat No. 6,225,202B1 (Gupta et al) teaches a method for removing unreacted nickel or cobalt after silicidation wherein the unreacted nickel or cobalt layer is exposed to a plasma containing carbon monoxide gas. The carbon monoxide gas reacts with the unreacted nickel or cobalt thereby removing the unreacted nickel or cobalt from the substrate to complete salicidation of the integrated circuit device.

U.S. Pat. No. 4,778,536(Grebinski) teaches a method to strip resist in a short period of time wherein the object is positioned with the surface exposed to both a water vapor and sulfur trioxide vapor adjacent to the surface to provide a hot mixture comprising sulfur trioxide, water and sulfuric acid. Energy requirements are relatively low since the components are easily vaporized.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat No. 6,231,775(Levenson et al.) shows a process for the ashing of an organic film which comprises a plasma.

U.S. Pat. No. 6,242,165B1(Vaartstra) shows an organic removal process.

U.S. Pat. No. 5,358,601(Cathey) shows an etch process for a multi-layered structure including suicides.

U.S. Pat. No. 4,778,536(Grebinski) teaches a method to strip resist wherein the surface is exposed to both a water vapor and sulfur trioxide vapor adjacent to the surface to provide a hot mixture comprising sulfur trioxide, water and sulfuric acid.

U.S. Pat. No. 3,985,597(Zielinski) reveals a passivated metal interconnect process.

U.S. Pat. No. 5,259,923(Hori et al.) shows a multi-layer etch including suicides.

SUMMARY OF THE INVENTION

An object of an embodiment of the invention is to provide a method of removing a metal using S and O containing gas.

An object of an embodiment of the present invention is to provide an effective and easily manufacturable method of removing unreacted metal after silicidation using a two step, dry then wet, treatment.

A further object of an embodiment of the invention is to provide a method of removing unwanted metal using wet-dry treatment comprising a gas or a mixture of gases followed by liquid treatment.

Yet another object of an embodiment is to provide a method of removing unreacted titanium, nickel or cobalt after silicidation using two step dry-wet treatment.

Yet another object of an embodiment is to provide a method of removing unwanted titanium, nickel or cobalt using dry-wet treatment wherein the dry portion of the dry-wet treatment comprises a gas or a mixture of gases.

Yet another object of an embodiment is to provide a method of removing unwanted titanium, nickel or cobalt using dry-wet treatment wherein the wet portion of the dry-wet treatment comprises a liquid.

Yet another object of an embodiment is to provide a method of removing unwanted nickel or cobalt using dry-wet treatment wherein the gas or a mixture of gases in the dry portion of the dry-wet treatment is selected from a group comprising sulfur trioxide and sulfur dioxide.

Yet another object of an embodiment is to provide a method of removing unwanted nickel or cobalt using dry-wet treatment wherein the wet portion of the dry-wet treatment comprises deionized water.

The present invention provides an embodiment to remove a metal from over a substrate in the fabrication of an integrated circuit device. The embodiment comprises providing a metal layer over a substrate; removing the metal layer by reacting the metal layer with a reactant gas to form at least a solid product; the reactant gas contains at least S and O; then dissolving the solid product in a liquid, thereby removing at least portion of the metal layer from over the substrate.

Another aspect of a preferred embodiment is a method for removing nickel, titanium or cobalt using dry-wet treatment in the manufacture of an integrated circuit. A metal, such as nickel, titanium or cobalt layer on a substrate is exposed to a gas or a mixture of gases selected from a group comprising sulfur trioxide and sulfur dioxide wherein the gas or the mixture of gases reacts with the metal to form a product. The product is then removed through dissolution in a liquid, thereby removing the metal from the substrate.

Also in accordance with the objects of the invention a method for removing unreacted nickel or cobalt after silicidation using dry-wet treatment is provided. Shallow trench isolation regions are formed in a semiconductor substrate surrounding and electrically isolating an active area from other active areas. A gate electrode and associated source and drain regions are formed in the active area wherein dielectric spacers are formed on sidewalls of the gate electrode. A nickel or cobalt layer is deposited over the gate electrode and associated source and drain regions. The semiconductor substrate is annealed whereby the nickel or cobalt layer overlying the gate electrode and said source and drain regions reacts to form a nickel or cobalt silicide layer and wherein the nickel or cobalt layer overlying the dielectric spacers and the shallow trench isolation regions is unreacted. The unreacted nickel or cobalt layer is exposed to a gas or a mixture of gases selected from a group comprising sulfur trioxide and sulfur dioxide wherein the gas or the mixture of gases reacts with the metal to form a product which is then removed through dissolution in a liquid, thereby removing the metal from the substrate to complete the silicidation of the integrated circuit device.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention provides a method for removing metal, such as nickel, titanium or cobalt, from a semiconductor piece. In a preferred embodiment, a metal is removed after salicidation or in a rework step.

Figure 1A:
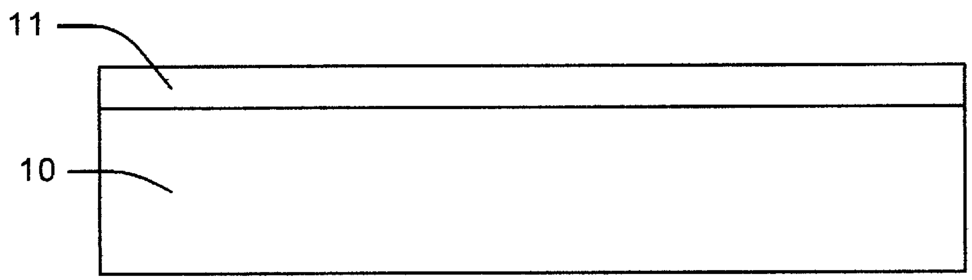
FIGS. 1A, 1B and 1C are cross sectional views for illustrating preferred embodiment of the invention for a method of removing a metal layer from over a substrate using a S and O containing gas.
Figure 1B:
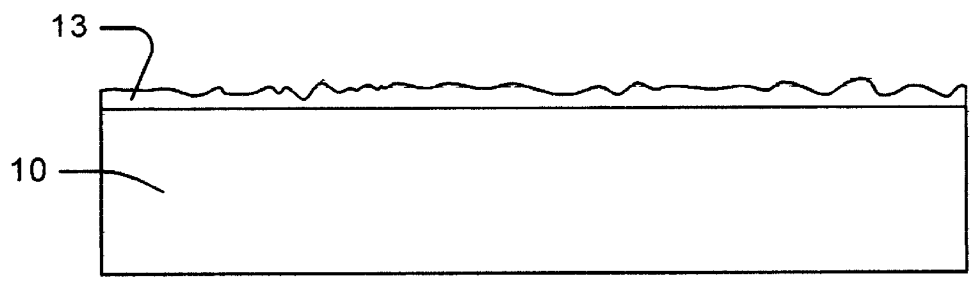
Figure 1C:
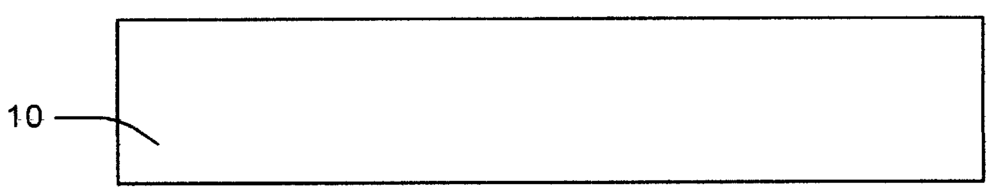

It will be understood by those skilled in the art that the present invention should not be limited to the embodiment described herein, but can be applied and extended in a variety of applications. The general removal of metal from over a substrate is illustrated in FIGS. 1A, 1B and 1C. The removal of unreacted metal after salicidation is illustrated in FIGS. 2 through 5.

I. First General Embodiment

FIG. 1A shows a simplified cross sectional view of a metal layer 11 over a substrate 10. The substrate can represent a semiconductor (e.g., Si) wafer or a semiconductor structure such as a wafer with layers over the wafer. The invention is not limited by the type of substrate. The metal layer 11 can be comprised of: nickel, titanium, cobalt; and alloys and combinations of nickel, titanium, and cobalt. The metal layer can comprise for example, nickel-titanium alloy or cobalt-titanium alloy. The metal layer can be comprised of any metal(s) that reacts with sulfur and oxygen containing gases, such as sulfur trioxide or sulfur dioxide. The metal layer 11 can be comprised of several metal layers of the same or different composition.

Next, the metal layer is at least partially removed or reacted with the embodiment's two step process as described below. The first step is a dry gas reaction step that converts the metal into a solid product. The second step is a wet/liquid step that removes the solid product thereby removing the metal layer.

First Step—S & O Containing Gas Treatment

Referring to FIG. 1B, in a first step of a preferred embodiment, the metal layer is reacted with a reactant gas containing sulfur (S) and oxygen (O) elements to form a metal containing product 13. The reactant gas can comprise several gases or mixtures of gases. The first step can be performed with or without a plasma (plasma is optional) at a pressure between 1 mTorr and 760 Torr and at a wafer temperature between 15 and 200° C. The first step (e.g., dry step) is described as follows.

The metal (e.g., nickel, cobalt and/or titanium) is reacted with a reactant gas, preferably sulfur trioxide or sulfur dioxide or a mixture of sulfur trioxide and sulfur dioxide. The sulfur and oxide containing gases are not limited to sulfur trioxide or sulfur dioxide but can be a gas that incorporates both sulfur and oxygen (for example $SO_2Cl$, $SO_3F_2$, or $S_2O$). $SO_2Cl$ and $SO_3F_2$ are available as fuming liquids, but can be easily available as gases due to their high vapor pressure. When a carrier gas (e.g., $N_2$) passes over these liquids, the vapor component can be introduced into the chamber. It is thought that S & O gases react with metal well due to the favorable formation of metal-oxygen or metal sulfur bonding.

Preferably either argon or helium is used as the carrier gas in the gas (dry) treatment of the invention.

In another option, to enhance the reaction, the metal can be heated to temperature preferably between 15 and 400° C. and more preferably between 15 and 200° C. and most preferably between 30 and 100° C. in the reactor or reaction chamber.

In an option, plasma is applied to the reactant gas during the first step. This can be done with or without heating.

In yet another option, plasma is applied to the reactant gas and the metal is heated to a temperature preferably between 15 and 400° C. and more preferably of between about 15 and 200° C. The pressure is preferably between 1 mTorr and 760 Torr and more preferably between 1 mTorr and 760 mTorr and more preferably between 5 mTorr and 200 mTorr.

It is thought that the metal reacts with the gas to form at least $M(SO)_x$ (where M=Ni, Co, Ti and x is between 0.5 to 4) (e.g., metal containing product 13). Other bi-products can be formed such as metal oxides, and metal sulfides.

Second Step—Wet Step—Removal of Product Metal

The second step of the embodiment (e.g, Wet step) is described next. Referring to FIGS. 1B and 1C, the solid metal containing product 13 is at least partially removed or reacted.

In the embodiment, a liquid, preferably comprising water (wet treatment) is to used remove the metal containing product 13 (e.g., metal sulfates $(M(SO)_x)$). Preferably the liquid water comprises de-ionized water and more preferably consists of water. The liquid for the wet treatment is not limited to deionized water, but can be any liquid that dissolves the metal product 13 (e.g., $(M(SO)_x)$). For example, organic solvents can be used. The liquids can dissolve or rinse away the product. It is thought that water mostly dissolves the product.

Furthermore, the liquid can be heated to enhance the dissolution of the metal product. The liquid is preferably heated to a temperature between about 15 and 80° C. and preferably 25 and 80° C.

II. Silicide Preferred Embodiment

In another preferred embodiment, the invention is used to remove metal in a silicide process for fabricating semiconductor devices. See FIGS. 2, 3, 4 and 5.

Gate and S/D Structures

Figure 2:
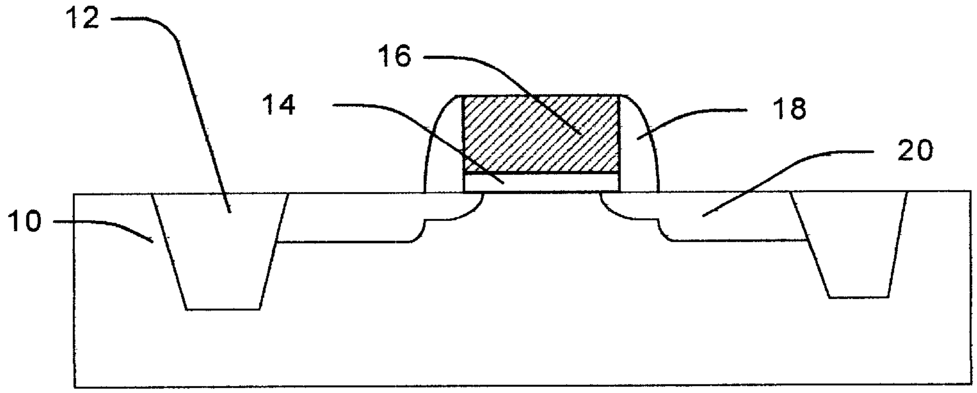
FIGS. 2 through 5 are cross sectional views for illustrating preferred embodiment of the invention for a method of removing a metal layer from over a substrate in a silicide process.

Referring now more particularly to FIG. 2, there is illustrated a portion of a partially completed integrated circuit. The semiconductor substrate 10 is preferably, comprised of silicon having a <100> crystallographic orientation. Other substrates can be used and the invention is not limited by the substrate. The substrate may be n- or p-type silicon. Semiconductor device structures may be formed as is conventional in the art. For example, isolation regions 12, such as shallow trench isolation (STI) regions, separate active areas of the substrate from one another. A gate dielectric layer 14 is formed over the substrate 10. A gate electrode 16 is over the gate dielectric layer 14. The gate electrode preferably is preferably comprised of polysilicon. Dielectric elements can be formed on portions of the gate electrode. The dielectric elements are preferably sidewall spacers 18 on the gate 16 sidewalls. Source/drain junctions 20 which can include LDD regions are formed. Sidewall spacers 18 typically are comprised of silicon nitride, silicon oxide, silicon oxynitride or a mixture of these.

Metal Layer Formation

Figure 3:
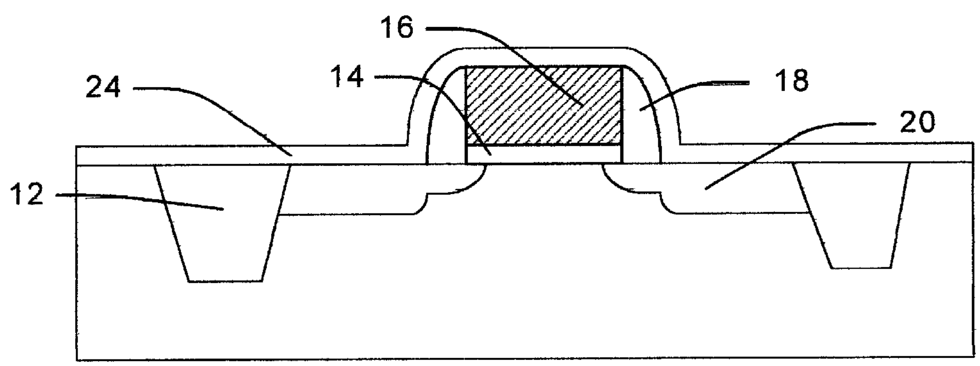

Referring now to FIG. 3, a metal layer 24 is formed over the surface of the substrate. The metal layer can be formed by a sputtering process. The metal layer 24 may comprise nickel, cobalt or titanium or alloys thereof. The metal layer can comprise two or more metal layers. The metal layer is preferably deposited to a thickness of between about 50 and 2000 Angstroms.

When the metal layer 24 is comprised of nickel and cobalt, a refractory metal such as titanium may be deposited over the cobalt or nickel to a thickness of between about 50 and 200 Angstroms. Silicidation results in the formation of the metal silicide on the gate electrode and the associated source and drain regions.

Anneal

Figure 4:
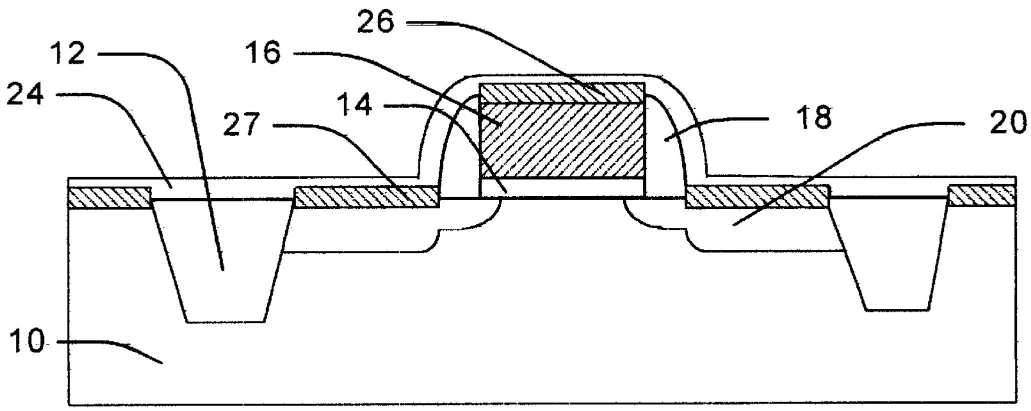

Referring to FIG. 4, the structure is annealed so that portions of the metal layer 24 are reacted with underlying silicon to form metal silicide regions. The metal silicide 26 27 can be formed, for example, on the gate 16 (e.g., gate silicide 26) and over the source/drain regions 20 (e.g., S/D silicide 27) by a rapid thermal process (RTA). During RTA, most of the metal layer overlying the gate 16 and the silicon substrate 10 in the source/drain regions 20 reacts with the underlying silicon to form a metal silicide 26 27, shown in FIG. 4. The amount of metal that reacts with the underlying silicon depends, on other factors, on the thickness of the deposited metal, the temperature and the duration of the RTA. It is typical to have unreacted metal 24 remaining on top of the metal silicide at the gate electrode, isolation regions 12 and the associated source and drain regions and other areas. The metal layer 24 overlying the dielectric spacers 18 and the STI regions 12 is unreacted. Other silicide processes can be used, such as processes that silicide only the gate or the S/D regions, or silicide the S/D and gate in separate steps or that comprise raised S/D regions or trenched gates or vertical gates.

Step 1—The Removal of Unreacted Metal

Figure 5:
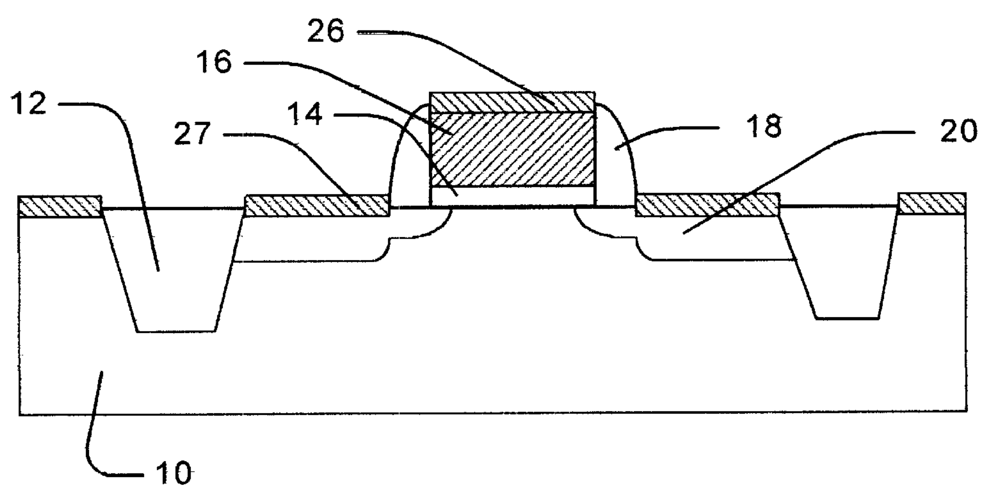

Referring to FIG. 5, the metal can then be removed using the embodiment's two step process described above. A preferred process is also described.

First, a reactant gas containing sulfur and oxygen is reacted with the metal. Preferably the reactant gas preferably comprises: 1) sulfur trioxide or 2) sulfur dioxide or 3) a mixture of sulfur trioxide ($SO_3$) and sulfur dioxide ($SO_2$) gases. Where both sulfur dioxide and sulfur trioxide gases are used, the ratio between the sulfur trioxide and sulfur dioxide is between 10,000:1 and 1:1000.

In addition, a carrier gas can be used, such as Ar or He. The ratio or flow ratio between the reactant gas and the carrier gas is preferably between 1:1000 and 1:1.

The metal can be heated to a temperature between 15 and 400° C. at a pressure preferably between 1 mTorr and 760 Torr and more preferably between 5 mTorr and 760 mTorr.

Another option is to generate a plasma by means of RF or microwave frequency to the gas or the mixture of gases. Plasma is an electrically neutral mixture of positive ions, negative ions, electrons, atoms, molecules, and radicals. The pressure regime for such plasma is typically between 5 mTorr and 760 mTorr and preferably between 5 mTorr and 500 mTorr and more preferably between 5 and 200 mTorr. RF or microwave is preferably capacitively coupled to the plasma. A plasma tools by Mattson (USA), Gasonics (San Jose, USA) and Applied Materials (USA) can be used.

Moreover, both metal heating and gas plasma can used. The $SO_x$ gas can slowly react with the metal without heating or plasma. The process including both heat and plasma is preferred.

The reactions for the gas treatment are thought to be as follows:

$$Ni(s)+SO_3(g) \text{ and/or } SO_2(g) \rightarrow Ni(SO)_x(s) \quad (1)$$

If the metal 24 is cobalt, the reaction is:

$$CO(S)+SO_3(g) \text{ and/or } SO_2(g) \rightarrow CO(SO)_x(s) \quad (2)$$

If the metal 24 is titanium, the reaction is $$Ti(s)+SO_3(g) \text{ or } SO_2(g) \text{ or a mixture Of } SO_2(g) \text{ and } SO_3(g) \rightarrow Ti(SO)_x(s) \quad (3)$$

The reactant gas containing sulfur and oxygen has a high selectivity between metal and metal silicide (e.g. between nickel and nickel silicide). Therefore almost no reacting with the silicide regions 26 27 occur.

Step 2—Removal of Metal Product with Liquid Step

In the second step (e.g., Wet step), a liquid, preferably water (wet treatment) to used remove the metal product 13 (e.g., metal sulfates). Preferably the water is deionized water. The liquid for the wet treatment is not limited to deionized water, but can be any liquid that dissolves the metal product 13 (e.g., (M(SOx)). For example, other liquids such as organic solvents can be used.

Furthermore, the liquid can be heated to enhance the dissolution of the metal product. The liquid is preferably heated to a temperature between 25 and 80° C.

Nickel sulfate, cobalt sulfate and titanium sulfate are soluble in deionized water. The invention's removal of the metal and metal products is very cost effective relative to the prior arts wet chemical methods that uses corrosive acids or alkalis.

FIG. 5 illustrates the integrated circuit after removal of the unreacted metal (e.g., nickel or cobalt) 24 according to the process of the present invention. Processing continues as is conventional in the art to complete the integrated circuit device.

Dry & Wet Treatment in Separate Equipment

The embodiment's first step (S and O gas step) can be performed in commercially available tools such as ashers from Gasonics, Mattson or etchers from Applied Materials, Tokyo Electron Limited (TEL).

The wet second step can be performed preferably in single wafer cleaning systems from SEZ (Austria) or Semitool (Montana, USA).

Separate equipment can be used to perform the dry and the wet treatments.

Integrated Dry & Wet Treatments in Same Equipment/tool

Both dry (gaseous) and wet treatments are preferably performed in the same chamber or within the same equipment using different chambers (integrated concept) for cost savings. For example an asher tool, from Gasonics can be used to perform the step first gas (optional plasma) step and step second the liquid rinse step.

Note that the salicide process described above is for illustration only and other silicide processes can be used with the invention.

Option For TiN Over Metal Layer

In another embodiment, a metal nitride layer is formed over the metal layer. For this embodiment, the metal nitride layer is removed to expose the metal layer and then the invention's two step process is used to remove the metal layer. An example is given as follows.

A titanium nitride layer or a titanium-titanium nitride bilayer is deposited over the metal layer (e.g., nickel or cobalt). The unreacted metal cannot be removed using the aforementioned two step dry-wet treatment since titanium nitride does not react with the reactant gas containing sulfur and oxygen. In applications with a refractory metal nitride (like titanium nitride), the refractory metal nitride is removed to expose the metal layer. Then the invention's 2 step process is used to remove the metal layer.

The metal nitride layer is preferably removed using a wet chemical etch such as utilizing alkaline solution (e.g. Ad SC-1). Alternatively, the unreacted titanium nitride or titanium-titanium nitride can be removed through dry etching wherein the etching chemistry comprises one or more gases from the group containing chlorine, boron trichloride ($BC1_3$), chlorine-substituted hydrocarbons, fluorine, fluorine-substituted hydrocarbons, nitrogen, and argon. The embodiments gas (S and O containing) treatment step can be performed either as a continuing step in the same etching chamber as the metal nitride removal or in another etching chamber in the same equipment, or in another equipment.

Rework

The dry-wet treatment may also be used in the case of stripping/rework of deposited nickel or cobalt over a wafer. In this case, the dry-wet treatment will remove the metal from the wafer easily and at low cost without wet chemical disposal concerns.

Recovery of Metals

After the metal is removed using the invention's two (dry & wet) process, the metal can be recovered from the metal product and liquid. The invention can be extended to the recovery of the metals such as nickel or cobalt removed by performing electroplating or electrowinning of the collected $Ni(SO)_x$ or $Co(SO)_x$ solutions.

Advantages over Prior Art

The invention provides many advantages of the prior art.

The invention does not use expensive wet chemicals. The prior art's wet processes (e.g., SC-1) drawbacks include the expensiveness of high purity chemicals, disposal costs, and the corrosive nature of the chemicals. In contrast, the invention only uses a liquid rinse.

The invention's removal of the metal and metal products is very cost effective relative to the prior arts wet chemical methods that uses corrosive acids or alkalis.

Also, the invention provides a method to recover the metals in the liquid or solid product.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate different sized reactors as is known to those skilled in the art.

Unless explicitly stated otherwise, each numerical value and range should be interpreted as being approximate as if the word "about" or "approximately" preceded the value or range.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of removing metal in the fabrication of an integrated circuit device comprising:

a) providing a metal layer over a substrate;

b) reacting said metal layer with a reactant gas to form at least a solid product; said reactant gas contains sulfur and oxygen elements; and c) removing said solid product using a liquid, thereby removing at least portion of said metal layer from over said substrate.

2. The method of claim 1 wherein said metal layer is comprised of material selected from the group consisting of Ni, Ti, and Co.

3. The method of claim 1 wherein said reactant gas is comprised of sulfur trioxide and sulfur dioxide.

4. The method of claim 1 wherein the step of reacting said metal layer with said reactant gas is performed at a temperature between 15 and 200° C.

5. The method of claim 1 wherein the step of reacting said metal layer with said reactant gas is performed at a temperature between 15 and 200° C. and a plasma power is applied to said reactant gas and the pressure is between about 5 mTorr and 200 mTorr.

6. The method of claim 1 wherein said liquid comprises water.

7. The method of claim 1 wherein said liquid is comprised of water at a temperature between 15 and 80° C.

8. A method of removing metal in the fabrication of an integrated circuit device comprising:

a) providing a metal layer over a substrate; said metal layer is comprised of material selected from the group consisting of Ni, Ti, and Co;

b) reacting said metal layer with a reactant gas to form at least a solid product; where said reactant gas is comprised of sulfur trioxide, and sulfur dioxide; the reaction is performed at a temperature between about 15 and 200° C.; and at a pressure between 1 mTorr and 760 Torr;

c) removing said solid product with a liquid, thereby removing at least portion of said metal layer from over said substrate; said liquid comprises water.

9. The method of claim 8 wherein the step of reacting said metal layer with said reactant gas is performed at a temperature between 15 and 200° C. and a plasma power is applied to said reactant gas and the pressure is between about 5 mTorr and 200 mTorr.

10. The method of claim 8 wherein said liquid is comprised of water at a temperature between 25 and 80° C.

11. A method of removing metal from an integrated circuit device in a silicide process comprising:

a) providing a gate electrode over a substrate; said gate electrode having sidewalls; providing source and drain regions adjacent said gate electrode in said substrate;

b) forming a metal layer over said substrate, said gate electrode, said source and drain regions, and said dielectric element;

c) annealing said substrate to form metal silicide regions over at least one of the following: said gate electrode, said source and drain regions; and leaving portions of said metal layer;

d) exposing said metal layer to a reactant gas; said reactant gas reacts with said metal to form at least a solid product; said reactant gas contains the elements S and O; and e) removing said solid product using a liquid.

12. The method of claim 11 wherein said metal layer is comprised of a metal that reacts with a gas containing the elements S and O.

13. The method of claim 11 wherein said metal layer is comprised of material selected from the group consisting of Ni, Ti, and Co.

14. The method of claim 11 wherein said reactant gas is comprised of sulfur trioxide, or sulfur dioxide.

15. The method of claim 11 wherein said reactant gas is comprised of sulfur trioxide and sulfur dioxide; the ratio between sulfur trioxide and sulfur dioxide is between 10,000:1 and 1:1000.

16. The method of claim 11 wherein the step of reacting said metal layer with said reactant gas is performed at a temperature between 15 and 200° C.

17. The method of claim 11 wherein the step of reacting said metal layer with said reactant gas is performed at a temperature between 15 and 200° C. and a plasma power applied to said reactant gas and the pressure is between about 5 mTorr and 200 mTorr.

18. The method of claim 11 wherein said liquid comprises water.

19. The method of claim 11 wherein said liquid is comprised of water at a temperature between 15 and 80° C.

20. The method of claim 11 wherein said metal is recovered from the solid product and said liquid by electroplating or electrowinning process.

21. The method of claim 11 wherein said reactant gas comprises a carrier gas selected from the group consisting of argon and helium.

22. The method of claim 11 further comprises: depositing a titanium layer overlying said metal layer before said annealing step wherein said step of exposing said metal layer to said gas or a mixture of gases.

23. The method of claim 11 further comprises: depositing a titanium nitride layer overlying said metal layer before said annealing step; and removing any unreacted said titanium nitride layer before said step of exposing said metal layer to said reactant gas.

24. The method of claim 11 further comprises: depositing a titanium nitride layer overlying said metal layer before said annealing step; and removing unreacted said titanium nitride layer using a wet or dry chemical treatment before said step (d) of—exposing said metal layer to said reactant gas.

25. The method of claim 11 wherein said liquid is deionized water.

26. A method of removing metal from an integrated circuit device in a silicide process comprising:

a) providing a gate electrode over a substrate; said gate electrode having sidewalls; providing source and drain regions adjacent said gate electrode in said substrate; providing a dielectric element on at least a portion of said sidewall of said gate electrode; said dielectric element is a spacer;

b) forming a metal layer over said substrate, said gate electrode, said source and drain regions, and said dielectric element;

(1) said metal layer is comprised of material selected from the group consisting of Ni, Ti, and Co;

c) annealing said substrate to form metal silicide regions over at least one of the following: said gate electrode, said source and drain regions; and leaving portions of said metal layer;

d) exposing said metal layer to a reactant gas form at least a solid product; the step of reacting said metal layer with said reactant gas is performed at a temperature between 15 and 200° C. and at a pressure between 1 mTorr and 760 Torr; said, reactant gas is comprised of sulfur trioxide or sulfur dioxide;

e) dissolving said solid product in a liquid; said liquid comprises water.

27. The method of claim 26 wherein the step of exposing said metal layer to a reactant gas form at least a solid product; comprises: reacting said metal layer with said reactant gas at a temperature between 15 and 200° C. and a plasma power applied to said reactant gas and the pressure is between about 5 mTorr and 200 mTorr.

28. The method of claim 26 which further includes said metal is recovered from said solid product and said liquid by a electroplating or electrowinning process.

29. The method of claim 26 wherein said liquid is comprised of water at a temperature between 15 and 80° C.

30. The method of claim 26 wherein said reactant gas comprises a carrier gas selected from the group consisting of argon and helium.

31. The method of claim 26 further comprises:

depositing a titanium layer overlying said metal layer before said annealing step wherein said step of exposing said metal layer to said reactant gas.

32. The method of claim 26 further comprises: depositing a titanium nitride layer over said metal layer before the annealing step; and removing said titanium nitride layer before the step of exposing said unreacted metal layer to said reactant.

33. The method of claim 26 further comprises: depositing a titanium nitride layer over said metal layer before the annealing step; and removing said titanium nitride layer before the step of exposing said unreacted metal layer to said reactant gas; said step of removing unreacted said titanium nitride layer comprises a wet chemical treatment.

34. The method of claim 26 further comprises: depositing a titanium nitride layer over said metal layer before the annealing step; and removing said titanium nitride layer before the step of exposing said metal layer to said reactant gas; said step of removing unreacted said titanium nitride layer comprises dry etching.

35. The method of claim 26 wherein a plasma can be applied to said reactant gas.

36. A method of removing metal in the fabrication of an integrated circuit device comprising:

a) providing a metal layer over a substrate;

b) exposing said metal layer to a reactant gas wherein said reactant reacts with said metal to form at least a solid product;

c) dissolving said solid product in a liquid, thereby removing at least portion of said metal layer from said substrate.

37. The method according to claim 36 wherein said metal layer comprised of a material selected from the group consisting of nickel and cobalt.

38. The method according to claim 36 wherein said reactant gas contains oxygen and sulfur in their composition.

39. The method according to claim 36 wherein said reactant gas is comprised of a gas selected from the group consisting of sulfur trioxide and sulfur dioxide.

40. The method according to claim 36 wherein said reactant gas further comprises a carrier gas; said carrier gas is comprised of a gas is selected from the group consisting of argon and helium.

41. The method according to claim 36 wherein said metal layer comprises nickel and wherein said substrate is maintained at a temperature of between 15 and 200° C. during said step of exposing said metal layer to said gas or mixture of gases.

42. The method according to claim 36 wherein said metal layer comprises nickel or a nickel alloy and wherein said substrate is maintained at a temperature of between 15 and 200° C. during said step of exposing said metal layer to said reactant gas.

43. The method according to claim 36 wherein said metal layer comprises titanium and wherein said substrate is maintained at a temperature of between 15 and 200° C. during said step of exposing said metal layer to said reactant gas.

44. The method according to claim 36 wherein a plasma is applied to said reactant gas.

45. The method according to claim 36 wherein said metal layer comprises nickel and wherein said substrate is maintained at a temperature of between 15 and 200° C. during said step of exposing said metal layer to said reactant gas.

46. The method according to claim 36 wherein said metal layer comprises cobalt and wherein said substrate is maintained at a temperature of between 15 and 200° C. during said step of exposing said metal layer to said reactant gas.

47. The method according to claim 36 wherein said metal layer comprises titanium and wherein said substrate is maintained at a temperature of between 15 and 200° C. during said step of exposing said metal layer to said reactant gas.

48. The method according to claim 36 wherein said liquid is deionized water.

49. The method according to claim 36 wherein the dissolving of product is performed at a temperature between 15 and 80° C.

50. The method according to claim 36 wherein said metal is recovered from said liquid by electroplating or electrowinning.

51. A method of removing metal from an integrated circuit device in a silicide process comprising:

a) providing a substrate surrounding and electrically isolating an active area from other active areas; providing a gate electrode and spacer on the sidewalls of said gate; providing source and drain regions adjacent said gate in said substrate;

b) forming a metal layer over said substrate, said gate electrode, said source and drain regions, and said spacers; said metal layer is formed of a material selected from the group consisting of titanium, nickel and cobalt;

c) annealing said substrate to form metal silicide regions over at least one of the following: said gate or said source and drain regions; and leaving portions of said metal layer;

d) exposing said metal layer to a reactant gas form at least a solid product at a temperature is maintained of between 15 and 200° C., at a pressure between 5 and 200 mTorr, and in an applied plasma; said reactant gas is selected from a group that consists of sulfur trioxide and sulfur dioxide; and e) dissolving said solid product in a liquid; said liquid comprises water.

52. The method according to claim 51 wherein said reactant gas further comprises a carrier gas selected from the group consisting of argon and helium.

53. The method according to claim 51 wherein further comprises:

depositing a titanium nitride layer overlying said metal layer before said annealing step; and removing unreacted said titanium nitride layer before said step of exposing said unreacted metal layer to said reactant gas.

* * * * *